(12) United States Patent
Langer et al.

(10) Patent No.: US 8,422,148 B2
(45) Date of Patent: Apr. 16, 2013

(54) APPARATUS FOR SHAPING OF LASER RADIATION

(75) Inventors: Björn Langer, Olfen (DE); Andre Timmermann, Freren (DE)

(73) Assignee: LIMO Patentverwaltung GmbH & Co. KG, Dortmund (DE)

( * ) Notice: Subject to any disclaimer, the term of this patent is extended or adjusted under 35 U.S.C. 154(b) by 340 days.

(21) Appl. No.: 12/667,562

(22) PCT Filed: Jun. 25, 2008

(86) PCT No.: PCT/EP2008/005122
§ 371 (c)(1),
(2), (4) Date: Feb. 5, 2010

(87) PCT Pub. No.: WO2009/003618
PCT Pub. Date: Jan. 8, 2009

(65) Prior Publication Data
US 2010/0165487 A1    Jul. 1, 2010

(30) Foreign Application Priority Data
Jul. 3, 2007    (DE) .......................... 10 2007 030 921

(51) Int. Cl.
*G02B 17/00*    (2006.01)
(52) U.S. Cl.
USPC ........................................................ 359/726

(58) Field of Classification Search .................. 359/726, 359/639, 640, 742, 796
See application file for complete search history.

(56) References Cited

U.S. PATENT DOCUMENTS

| 5,557,475 A | 9/1996 | Nightingale et al. |
| 5,636,069 A | 6/1997 | Nightingale et al. |
| 6,816,318 B2 | 11/2004 | Mikhailov |

FOREIGN PATENT DOCUMENTS

| DE | 19846532 C1 | 5/2000 |
| DE | 29824154 U1 | 6/2000 |
| DE | 10106155 A1 | 8/2002 |
| EP | 0770226 B1 | 8/1998 |

*Primary Examiner* — Jack Dinh
(74) *Attorney, Agent, or Firm* — Laurence A. Greenberg; Werner H. Stemer; Ralph E. Locher

(57) ABSTRACT

A device for shaping laser radiation, in particular for laser radiation emitted by a laser diode bar, has at least one substrate with a plurality of refractive boundary surfaces through which the laser radiation to be produced can pass in such a way that at least two partial beams of the laser radiation, which, prior to their passage, are adjacently arranged in a first direction, are adjacently arranged after their passage through the refractive boundary surfaces in a second direction which is perpendicular to the first direction. The refractive boundary surfaces are formed at a substrate or at substrates that are connected to one another.

19 Claims, 3 Drawing Sheets

US 8,422,148 B2

APPARATUS FOR SHAPING OF LASER RADIATION

BACKGROUND OF THE INVENTION

Field of the Invention:

The present invention relates to an apparatus for shaping of laser radiation, in particular for laser radiation which is emitted by a laser diode bar, comprising at least one substrate having a plurality of refractive boundary surfaces through which the laser radiation to be shaped can pass, such that at least two partial beams of the laser radiation which are arranged alongside one another in a first direction before they pass through the refractive boundary surfaces are arranged alongside one another in a second direction, which is at right angles to the first direction, after they pass through the refractive boundary surfaces.

Definitions: in the propagation direction of the light to be influenced means the mean propagation of the light, in particular when this is not a planar wave or is at least partially divergent. Unless expressly stated to the contrary, the terms light beam, partial beam or beam do not mean an idealized beam of geometric optics but a real light beam, for example a laser beam with a Gaussian profile, which does not have an infinitesimally small beam cross section, but an extended beam cross section.

One preferred application of the present invention is the shaping of the laser radiation from high-power laser diodes, which are manufactured as so-called laser diode bars. In these laser diode bars, a large number of individual emitters are mounted alongside one another on a heat sink in a different manner, depending on the power. The number of these individual emitters has a direct influence on the beam quality of the entire laser diode: the greater the number of individual emitters, the broader is the overall beam, and the poorer is the beam quality.

One apparatus of the type mentioned initially is known from European Patent EP 0 770 226 B1. The apparatuses described in this document comprise two or three substrates which are at a distance from one another and are not connected to one another on each of which two refractive surfaces are formed, which contribute to the shaping of the laser radiation. On the one hand, this means that the two or three substrates must be adjusted independently of one another, which is complex. On the other hand, the repeated entry into and exit from the substrates results in considerable losses.

The problem on which the present invention is based is to provide an apparatus of the type mentioned initially which can be adjusted more easily.

BRIEF SUMMARY OF THE INVENTION

According to the invention, this is achieved by an apparatus of the type mentioned initially having the characterizing features of claim 1. The independent claims relate to preferred refinements of the invention.

According to claim 1, the refractive boundary surfaces are formed on a substrate or on substrates which are connected to one another. This allows all of the refractive boundary surfaces to be moved together, thus reducing the adjustment complexity.

In this case, it is possible for the at least one substrate and/or the refractive boundary surfaces to be designed and arranged such that at least one of the partial beams passes through the apparatus and/or through the refractive boundary surfaces essentially without being deflected. In consequence, there are no undesirable changes to the cross section of this partial beam, and comparatively few losses.

It is also possible for the at least one substrate and/or the refractive boundary surfaces to be designed and arranged such that at least one of the partial beams is subject to at least one total internal reflection in the interior of the at least one substrate. This means that the at least one deflected partial beam is subject to the losses that are as small as possible on its path through the apparatus.

It is also possible to provide for the refractive boundary surfaces to be planar surfaces. This avoids undesirable changes to the beam profile. In particular, there is no influence on the divergence of the laser radiation. Furthermore, planar surfaces can be manufactured more easily.

According to one preferred refinement of the invention, the apparatus comprises a monolithic substrate on which the refractive boundary surfaces are arranged. A monolithic substrate such as this makes it possible to produce a compact apparatus of simple design, which can shape the laser radiation with low losses.

According to one alternative refinement of the invention, the apparatus comprises at least two substrates on which the refractive boundary surfaces are arranged, wherein the at least two substrates are connected to one another, preferably adhesively bonded. Substrates which are adhesively bonded to one another also allow the boundary surfaces to be moved together, which likewise reduces the adjustment complexity.

In particular, it is possible in this case to provide for the at least two substrates to have planar, in particular mutually parallel surfaces, and to preferably be in the form of cuboids. Cuboids or plane-parallel plates such as these can be manufactured easily, and therefore at low cost.

Further features and advantages of the present invention will become clear on the basis of the following description of preferred exemplary embodiments, and with reference to the attached figures, in which:

BRIEF DESCRIPTION OF THE SEVERAL VIEWS OF THE DRAWING

FIG. 2a shows a perspective view of the first embodiment, rotated in comparison to FIG. 1a;

FIG. 3a shows a perspective view of the first embodiment, rotated in comparison to FIG. 2a;

FIG. 4a shows a perspective view of the first embodiment, rotated in comparison to FIG. 3a;

DESCRIPTION OF THE INVENTION

In order to improve the clarity, a Cartesian coordinate system is shown in some of the figures.

The embodiment, as can be seen from FIG. 1a to FIG. 4b of an apparatus according to the invention, is in the form of a monolithic substrate 1 composed of a material which is at least partially transparent for the laser radiation 4 to be shaped. The substrate 1 has a planar inlet surface 2 (see FIG. 1a, FIG. 1b, FIG. 2a and FIG. 2b) and a planar outlet surface 3 which is parallel thereto (see FIG. 3a, FIG. 3b, FIG. 4a and FIG. 4b) for the laser radiation to be shaped, which are both arranged on an X-Y plane. The inlet surface 2 is more extended in the X direction (see the coordinate systems in FIG. 2a and FIG. 4a), in particular approximately twice as extended, as the outlet surface 3. In contrast, the outlet surface 3 is more extended in the Y direction, in particular approximately twice as extended as the inlet surface 2.

Figure 1A:
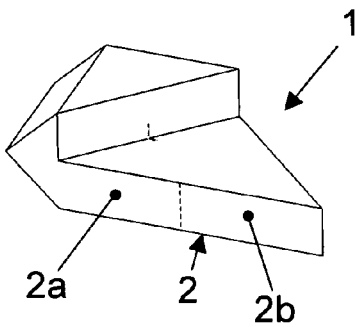
FIG. 1a shows a perspective view of a first embodiment of an apparatus according to the invention.
Figure 1B:
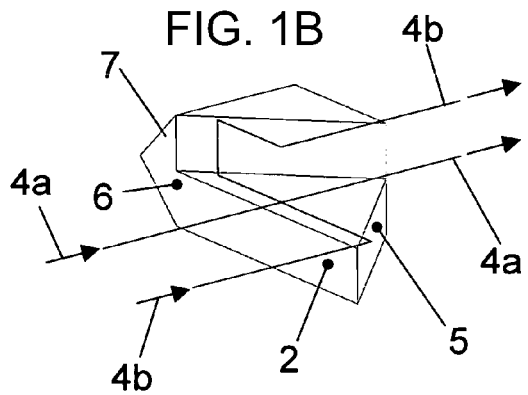
FIG. 1b shows a view of the first embodiment, corresponding essentially to FIG. 1a, showing two partial beams.

In FIG. 1a, the inlet surface 2 is split into two sections 2a and 2b, which are arranged alongside one another in the X direction, for illustrative purposes. Furthermore, in FIG. 3a, the outlet surface 3 is split into two sections 3a and 3b, which are arranged alongside one another in the Y direction, for illustrative purposes. The left-hand or first section 2a of the inlet surface 2 in FIG. 1a is directly opposite the lower or first section 3a of the outlet surface 3 in FIG. 3a, such that a partial beam 4a which enters the first section 2a in the Z direction, or at right angles to the inlet surface 2, emerges without being deflected from the first section 3a of the outlet surface 3 (in this context, see FIG. 1b to FIG. 4b). The partial beam 4a therefore passes through the monolithic substrate 1, and thus through the apparatus according to the invention, without being deflected.

The substrate 1 furthermore comprises a side surface 5 which includes an angle of 45° with the right-hand or second section 2b of the inlet surface 2. A partial beam 4b which enters the second section 2b of the inlet surface 2 in particular in the Z direction is totally internally reflected through 90° in the negative X direction on the inside of the side surface 5 (in this context, see for example FIG. 1b).

Figure 2A:
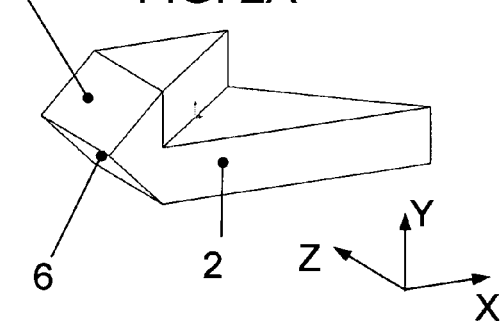
Figure 2B:
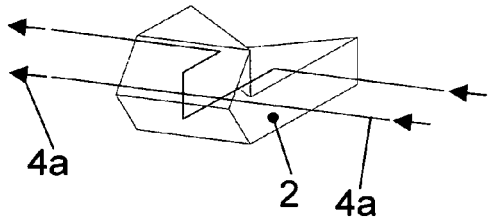
FIG. 2b shows a view of the first embodiment, corresponding essentially to FIG. 2a, showing two partial beams.
Figure 3A:
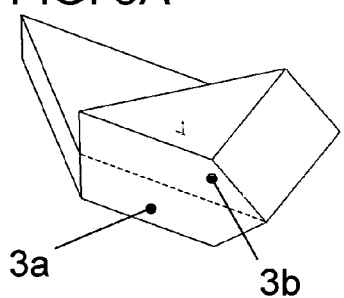
Figure 3B:
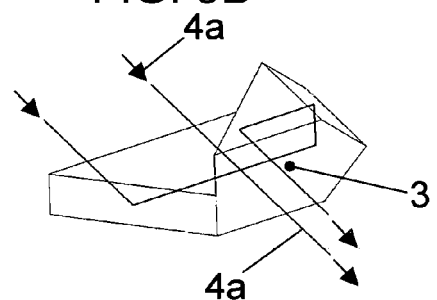
FIG. 3b shows a view of the first embodiment, corresponding essentially to FIG. 3a, showing two partial beams.

The substrate 1 furthermore comprises two side surfaces 6, 7 which include an angle of 90° between them and form a prismatic attachment on the side of the substrate 1 opposite the side surface 5 (see for example FIG. 2a). A partial beam 4b, which moves in the negative X direction, is totally internally reflected through 90° in the Y direction on the inside of the side surface 6 (in this context, see for example FIG. 1b). The partial beam 4b which moves in the Y direction is then totally internally reflected through 90° in the X direction on the inside of the side surface 7 (in this context, see for example FIG. 1b).

Figure 4A:
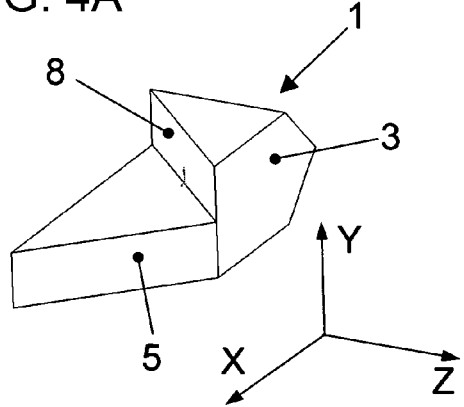
Figure 4B:
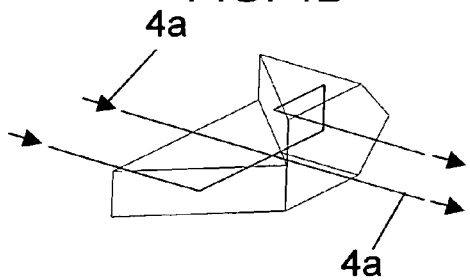
FIG. 4b shows a view of the first embodiment, corresponding essentially to FIG. 4a, showing two partial beams.

The substrate 1 furthermore comprises a side surface 8 which includes an angle of 45° with the second section 3b of the outlet surface 2 (see for example FIG. 4a). The partial beam 4b, which moves in the X direction, is totally internally reflected through 90° in the Z direction on the inside of the side surface 8 (in this context, see for example FIG. 1b). The partial beam 4b then emerges from the second section 3b of the outlet surface 3. Before passing through the substrate 1 in the X direction, the partial beam 4b was arranged alongside the partial beam 4a and, in FIG. 1b, to the right alongside the partial beam 4a and, after passing through the substrate 1 in the Y direction, is arranged alongside the partial beam 4a and, in FIG. 1b, above the partial beam 4a. The laser radiation 4 is therefore shortened, in particular halved, in the X direction and is increased, in particular doubled, in the Y direction.

Figure 5:
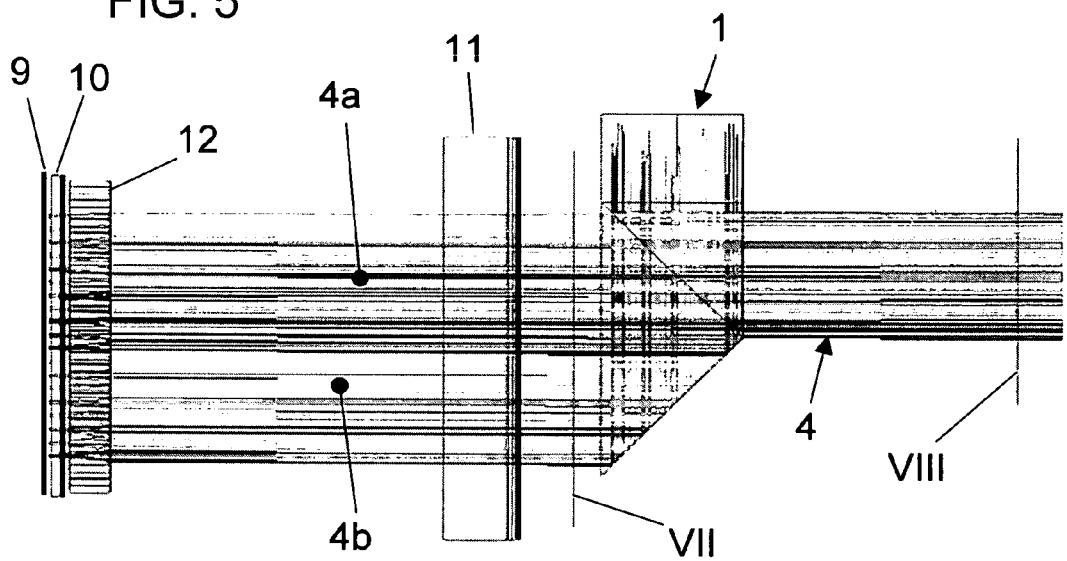
FIG. 5 shows a plan view of a laser arrangement with the first embodiment of an apparatus according to the invention.
Figure 6:
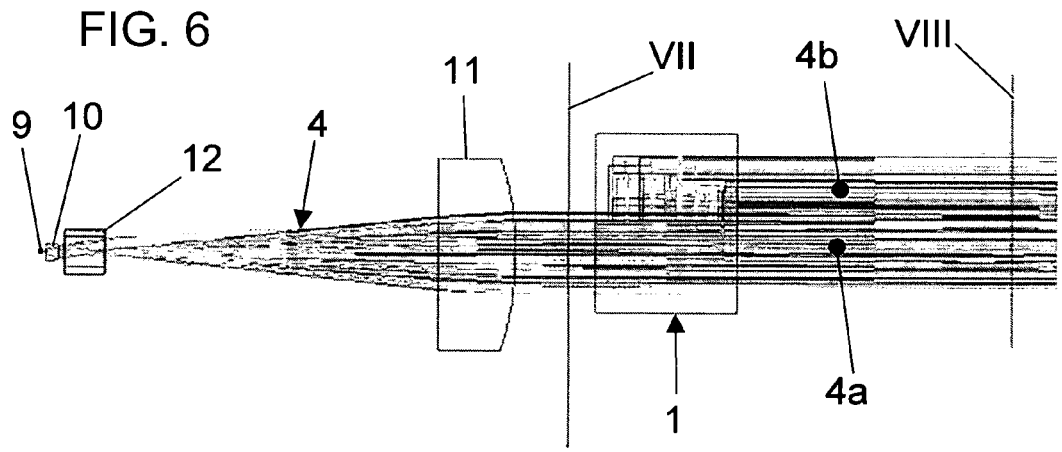
FIG. 6 shows a side view of the laser arrangement shown in FIG. 5.

FIG. 5 and FIG. 6 show a laser arrangement in which a substrate 1 is installed. The laser arrangement comprises a laser diode bar 9 which has a plurality of emitters which are arranged alongside one another in the X direction. The laser radiation 4 emitted from these emitters is collimated by a collimation means 10, 11, and is rotated by additional beam transformation means 12. After the second collimation, the laser radiation passes through the substrate 1. With regard to the laser radiation, a subdivision into partial beams 4a and 4b is indicated in the drawings, equivalent to FIG. 1b to FIG. 4b in order to illustrate the splitting and superposition of the laser radiation.

Figure 7:
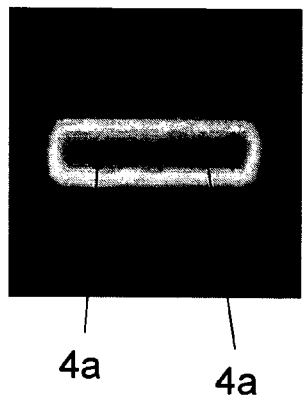
FIG. 7 shows a cross section through the laser radiation from the laser arrangement shown in FIG. 5, on the plane annotated VII.
Figure 8:
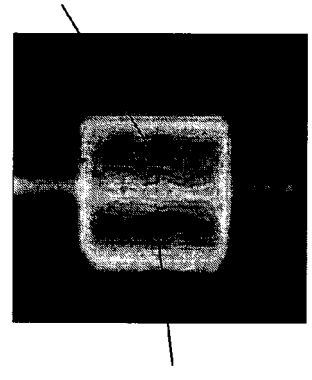
FIG. 8 shows a cross section through the laser radiation from the laser arrangement shown in FIG. 5, on the plane annotated VIII.

FIG. 7 shows a cross section through the laser radiation 4 on a plane VII in front of the substrate 1. FIG. 8 shows a cross section through the laser radiation 4 on a plane VIII behind the substrate 1. This shows that the cross section of the laser radiation has been converted from an elongated form with partial beams 4a, 4b arranged alongside one another, to an approximately square form with partial beams 4a, 4b arranged one above the other.

Figure 9:
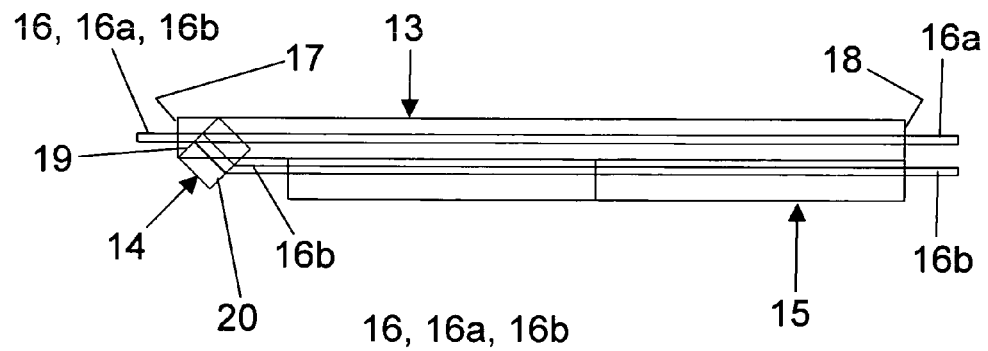
FIG. 9 shows a side view of a second embodiment of an apparatus according to the invention.
Figure 10:
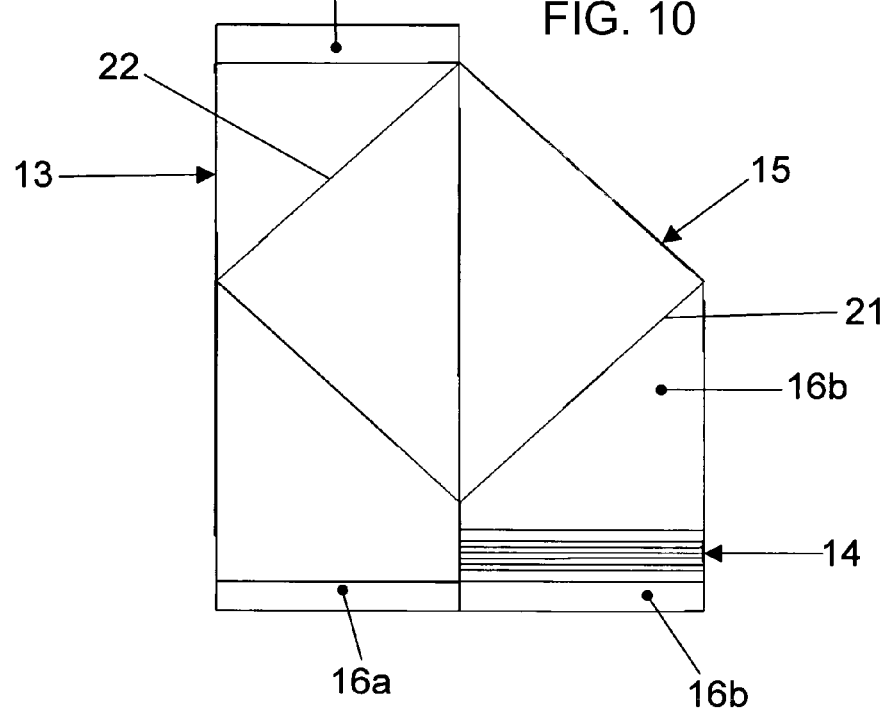
FIG. 10 shows a plan view of the embodiment shown in FIG. 9.
Figure 11:
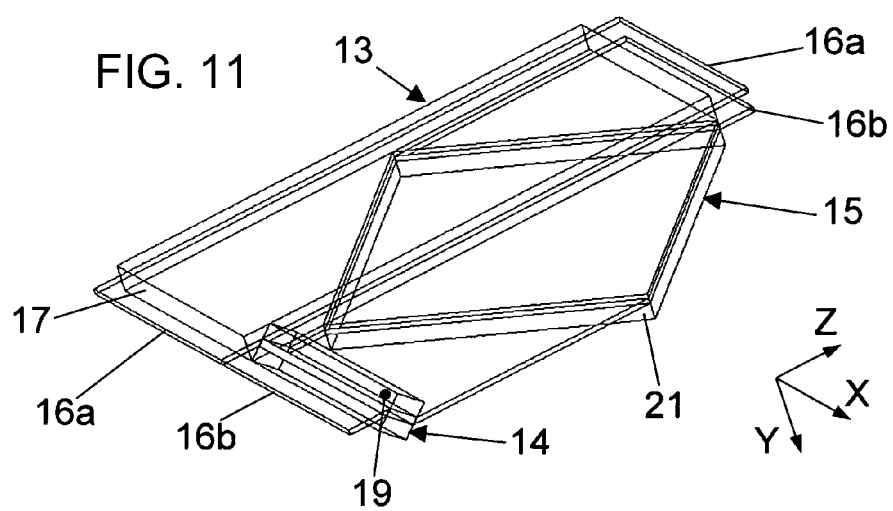
FIG. 11 shows a perspective view of the embodiment shown in FIG. 9.

FIG. 9 to FIG. 11 show a second embodiment of an apparatus according to the invention. The apparatus shown in these figures comprises three substrates 13, 14, 15, which are manufactured from a material which is at least partially transparent for the laser radiation 16 to be shaped. Each of the three substrates 13, 14, 15 is in the form of a cuboid. The three substrates 13, 14, 15 are adhesively bonded to one another.

The first substrate 13 is a part in the form of a plate which extends essentially in the Z direction, and has a considerably greater extent in the X direction than in the Y direction. The first substrate 13 has an inlet surface 17 and an outlet surface 18, both of which are arranged on an X-Y plane (see FIG. 9 and FIG. 11). A partial beam 16a of the laser radiation 16 which enters the inlet surface 17 in the Z direction emerges from the outlet surface 18 without being deflected. The partial beam 16a therefore passes through the substrate 13, and thus through the apparatus according to the invention, without being deflected.

The second substrate 14 has an inlet surface 19 which is arranged on a plane inclined at an angle of 45° to the X-Y plane. The second substrate 14 has an outlet surface 20, which is aligned parallel to the inlet surface 19 and is opposite it (see FIG. 9 and FIG. 11). A partial beam 16b of the laser radiation 16 which enters the inlet surface 19 in the Z direction likewise emerges from the outlet surface 20 in the Z direction. However, the emerging partial beam 16b is offset somewhat in the Y direction or downwards in FIG. 9 in comparison to the partial beam 16b on entry. The laser radiation 16 is therefore deflected in the Y direction in the second substrate 14.

The third substrate 15 is in the form of a plate with a square outline, which has a considerably smaller extent in the Y direction than in the X direction and in the Z direction. The third substrate 15 is arranged under the first substrate 13 and offset in the Y direction with respect to the first substrate 13, with respect to FIG. 9. An inlet surface 21 and an outlet surface 22 are each aligned at an angle of, for example, 45° to the Z direction (see FIG. 10).

A partial beam 16b which enters the inlet surface 21 in the Z direction is moved in the interior of the substrate 15 through an angle of for example 45° to the Z direction, and emerges from the outlet surface 22 again in the Z direction. However, the X position of the partial beam 16b is shifted in the negative X direction or to the left in FIG. 10, as a result of which the partial beam 16b now emerges below the partial beam 16a, or offset in the Y direction with respect thereto, from the outlet surface, with respect to FIG. 9. The apparatus which comprises the three substrates 13, 14, 15 therefore reshapes the laser radiation 16 which is extended in the X direction in a similar manner to that in which the substrate 1 reshapes the laser radiation 4.

According to the invention, it is possible to provide a fourth substrate, which is not shown that is comparable to the second substrate 14, and which deflects a portion of the laser radiation 16 upwards in FIG. 9, or in the negative Y direction. Furthermore, a fifth substrate can then be provided, which is not shown that is comparable to the third substrate 15, and which deflects that portion of the laser radiation which is deflected upwards in this way, in the X direction or to the right in FIG. 10. This allows laser radiation to be broken down into three parts, which are then arranged one above the other in the Y direction.

The invention claimed is:

1. An apparatus for shaping laser radiation, the apparatus comprising:
   a shaping substrate formed of one monolithic substrate or of a plurality of substrates connected to one another, said shaping substrate having a plurality of refractive boundary surfaces formed on said monolithic substrate or on said plurality of substrates;
   said boundary surfaces being disposed to allow the laser radiation to be shaped to pass therethrough and said shaping substrate being formed to cause at least two partial beams of the laser radiation that are arranged alongside one another in a first direction prior to passing through said refractive boundary surfaces to be arranged alongside one another in a second direction after passing through said refractive boundary surfaces, wherein the second direction is perpendicular to the first direction.

2. The apparatus according to claim 1, wherein the laser radiation to be shaped is laser radiation emitted by a laser diode bar.

3. The apparatus according to claim 1, wherein at least one of said shaping substrate and said refractive boundary surfaces are configured and arranged such that at least one of the partial beams is allowed to pass through said substrate and through said refractive boundary surfaces substantially without being deflected.

4. The apparatus according to claim 1, wherein at least one of said shaping substrate and said refractive boundary surfaces are configured and arranged such that at least one of the partial beams is subject to at least one total internal reflection in an interior of said shaping substrate.

5. The apparatus according to claim 1, wherein said refractive boundary surfaces are planar surfaces.

6. The apparatus according to claim 1, wherein said monolithic substrate is formed to cause at least one of the partial beams to be subject only to total internal reflections after entering said substrate and until emerging from said substrate.

7. The apparatus according to claim 6, wherein the at least one partial beam is subject to four total internal reflections.

8. The apparatus according to claim 6, wherein said monolithic substrate is configured to define each of the total internal reflections to have a deflection angle of 90°.

9. The apparatus according to claim 6, wherein an inlet surface and an outlet surface of said monolithic substrate are aligned parallel to one another.

10. The apparatus according to claim 1, wherein said shaping substrate comprises at least two substrates having said refractive boundary surfaces formed thereon, and wherein said at least two substrates are connected to one another.

11. The apparatus according to claim 10, wherein said at least two substrates are adhesively bonded to one another.

12. The apparatus according to claim 10, wherein said shaping substrate comprises three or five substrates having said refractive boundary surfaces formed thereon.

13. The apparatus according to claim 10, wherein said at least two substrates are configured and arranged such that at least one of the partial beams passes through only one of said substrates.

14. The apparatus according to claim 13, wherein the at least one partial beam passes through only one of said substrates substantially without being deflected.

15. The apparatus according to claim 10, wherein said at least two substrates are configured and arranged such that at least one of the partial beams passes through two substrates that are arranged one behind the other and are separated from one another, at least in places, in a propagation direction of the partial beam.

16. The apparatus according to claim 15, wherein one of said two substrates deflects the at least one partial beam with respect to the first direction, and the other of said two substrates deflects the at least one partial beam with respect to the second direction.

17. The apparatus according to claim 10, wherein said at least two substrates have planar surfaces.

18. The apparatus according to claim 17, wherein said at least two substrates have mutually parallel planar surfaces.

19. The apparatus according to claim 17, wherein said at least two substrates have a cuboid shape.

* * * * *